(12) United States Patent
Mashimo et al.

(10) Patent No.: US 6,661,445 B2
(45) Date of Patent: *Dec. 9, 2003

(54) EXPOSURE APPARATUS WITH AN ARRAY OF LIGHT EMITTING DEVICES

(75) Inventors: Seiji Mashimo, Yokohama (JP);
Noboru Koumura, Shizuoka-ken (JP);
Yukio Nagase, Shizuoka-ken (JP);
Yuichi Hashimoto, Tokyo (JP);
Akihiro Senoo, Kawasaki (JP);
Kazunori Ueno, Ebina (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/384,974

(22) Filed: Aug. 30, 1999

(65) Prior Publication Data

US 2002/0135664 A1 Sep. 26, 2002

(30) Foreign Application Priority Data

Aug. 31, 1998 (JP) ............................................ 10-244947
Aug. 31, 1998 (JP) ............................................ 10-244948

(51) Int. Cl.$^7$ .............................. B41J 2/45; B41J 2/385
(52) U.S. Cl. ...................................... 347/238; 347/130
(58) Field of Search ............................... 367/238, 130;
313/498, 500, 504, 505, 506, 509; 372/43,
46, 92, 95, 97, 98, 99, 101, 102; 148/33,
33.2; 396/548

(56) References Cited

U.S. PATENT DOCUMENTS

| | | | | | |
|---|---|---|---|---|---|
| 4,589,745 A | * | 5/1986 | Plummer | ................... | 396/548 |
| 4,865,655 A | * | 9/1989 | Fujita et al. | ................... | 148/33 |
| 5,065,434 A | | 11/1991 | Matsuoka et al. | ........... | 382/114 |
| 5,337,074 A | * | 8/1994 | Thornton | ................... | 347/237 |
| 5,554,911 A | * | 9/1996 | Nakayama et al. | ......... | 313/504 |
| 5,682,402 A | * | 10/1997 | Nakayama et al. | ........... | 372/99 |
| 5,834,893 A | * | 11/1998 | Bulovic et al. | ............. | 313/506 |
| 5,936,347 A | * | 8/1999 | Isaka et al. | .................. | 313/509 |
| 6,014,396 A | * | 1/2000 | Osinski et al. | ................. | 372/46 |
| 6,091,197 A | * | 7/2000 | Sun et al. | ...................... | 313/509 |
| 6,133,933 A | * | 10/2000 | Paoli | ........................... | 347/238 |
| 6,140,764 A | * | 10/2000 | Xu et al. | ...................... | 313/504 |

FOREIGN PATENT DOCUMENTS

JP  9-180883  7/1997

* cited by examiner

*Primary Examiner*—Hai Pham
(74) *Attorney, Agent, or Firm*—Fitzpatrick, Cella, Harper & Scinto

(57) ABSTRACT

An exposure apparatus performs exposure of a photosensitive body by an array of light emitting devices to form an image as a latent image thereon. The array of light emitting devices incorporate micro-optical cavities. The micro-optical cavities limit wavelengths of light emitted from the array of light emitting devices, so that the wavelength at a peak of emitted light is in a half width region of sensitivity versus wavelength of the photosensitive body.

3 Claims, 9 Drawing Sheets

EXPOSURE APPARATUS WITH AN ARRAY OF LIGHT EMITTING DEVICES

BACKGROUND OF THE INVENTION

1. Field of the Invention

The present invention relates to an exposure apparatus used in image forming apparatus such as copiers, optical printers, and so on.

2. Related Background Art

In the image forming apparatus of this type, a photosensitive body is exposed to light by the exposure apparatus to form an image thereon in the form of a latent image. There are exposure methods including a laser beam method and a light emitting device method.

Since the laser beam method necessitates such optical components as a polygon mirror, lenses, etc., it has problems that compactification of apparatus is not easy and that it is hard to achieve quicker operation.

It is thus suggested to adopt the light emitting device method free of such problems. In this method, however, if an array of light emitting devices are constructed on a single substrate, the substrate will be expensive. Therefore, a plurality of cut chips were arranged in an array. In that case, there are challenges of decreasing level differences between the chips and having to keep gaps uniform.

In the light emitting device method the light from the exposure apparatus is radiated through an optical system such as a rod lens array or the like onto the photosensitive body. However, because the light from the exposure apparatus diffuses, efficiency of incidence of light to rod lenses becomes lower, so that the quantity of Light reaching the photosensitive body becomes smaller. There thus arose a problem that the light emitting devices had to be made to emit excessive light, in order to gain the sufficient quantity of exposure light.

Organic light emitting devices are sometimes used in the light emitting device method. However, emission intensities of such devices are distributed in a wide wavelength range and a half width of emission intensities against wavelength is thus wide, about 100 nm. Because of it, emission components at wavelengths off a wavelength region in which the photosensitive body has a peak of sensitivity, become not to act effectively to the exposure of the photosensitive body. Therefore, there also arises a problem that the exposure efficiency is lowered.

An object of the present invention is to provide an exposure apparatus overcoming the above problems.

SUMMARY OF THE INVENTION

An exposure apparatus according to the present invention has a light emitting device array formed on a single substrate, each device in the array comprising a micro-optical cavity, wherein the micro-optical cavity limits wavelengths of light from the light emitting device array, so as to make a wavelength at a peak of luminescence present in a half width region of sensitivity versus wavelength of a photosensitive body.

In order to accomplish the above object, an exposure apparatus of the present invention comprises an array of light emitting devices, each device comprising an anode, a cathode, an organic compound layer interposed between the anode and the cathode and adapted to emit light by a voltage placed between the anode and the cathode, and a semi-transparent reflecting layer, wherein a micro-optical cavity is formed between the cathode and the semi-transparent reflecting layer and the cavity limits wavelengths of the emitted light, so that at least a peak of the emitted light is made present in a half width region of sensitivity versus wavelength of a photosensitive body.

In an embodiment of the present invention, the semi-transparent reflecting layer is in contact with the anode layer, the apparatus further comprises rod lenses for focusing the emitted light from the array of light emitting devices on the photosensitive body, or the apparatus further comprises microlenses for focusing the emitted light from the array of light emitting devices on the photosensitive body.

The present invention also provides an image forming apparatus comprising either of the above exposure apparatus; and the photosensitive body (211) for forming an image according to exposure by the exposure apparatus.

DETAILED DESCRIPTION OF THE PREFERRED EMBODIMENTS

The present invention will be described in detail by reference to the accompanying drawings.

Figure 1:
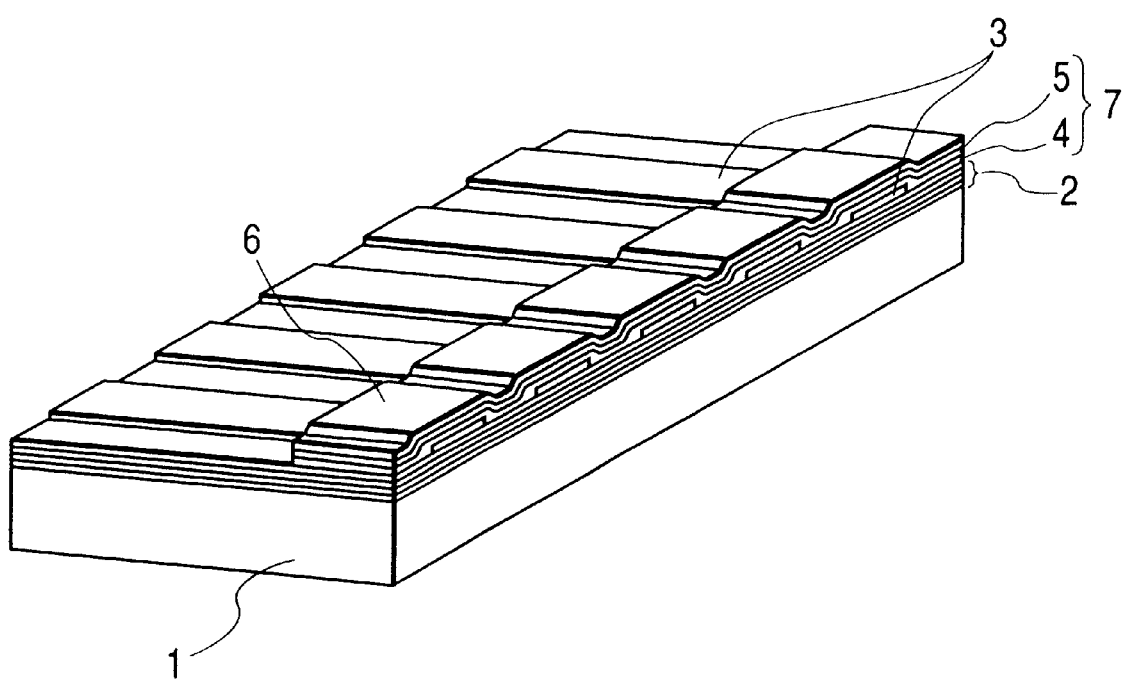
FIG. 1 is a perspective view to show an array of light emitting devices according to a first embodiment of the present invention.

FIG. 1 is a perspective view to show an example of the array of light emitting devices as an exposure apparatus of the present invention.

In FIG. 1, reference numeral 1 designates a substrate, 2 a semi-transparent reflecting layer, 3 anode layers comprised of transparent electrodes, 6 a cathode layer, and 7 an organic compound layer comprised of a hole transport layer 4 and an electron transport layer 5. When a voltage is placed between the anode layers 3 and the cathode layer 6, portions (light emitting portions) at intersections between the anode layers 3 and the cathode layer 6 emit light. The light emitting portions can be formed in arbitrary size by changing the electrode width of the anode layers 3 or the cathode layer 6.

In the array of light emitting devices, micro-optical cavity structures are constructed between the semi-transparent reflecting layer 2 and the cathode layer 6. This suppresses diffusion of light, so as to be able to decrease the spread of exposure light spots. In addition, it can narrow the half width of emission wavelengths and also intensify the output at the peak wavelength at the same time, which permits the quantity of emitted light to be utilized efficiently.

Further, the array of light emitting devices have an emission peak in the half width region of sensitivity versus wavelength of the photosensitive body undergoing exposure. Thanks to this, a good image can be obtained, a driving voltage can be made lower, and the life of the devices can be extended.

The exposure apparatus of the present invention preferably has an array of rod lenses for focusing the light emitted from the array of light emitting devices on the photosensitive body, between the array of light emitting devices and the photosensitive body. Since the array of light emitting devices has the optical cavity structures, it can suppress the diffusion of emitted light and considerably increase the light incidence efficiency to the rod lens array, whereby the emitted light can be utilized efficiently.

The substrate 1 can be any material on a surface of which the Light emitting devices can be formed. The substrate is preferably, for example, glass such as soda lime glass or the like, or a transparent insulating substrate such as a resin film or the like.

There are no specific restrictions on the semi-transparent reflecting layer 2 as long as it has the structure capable of increasing or decreasing the reflection transmittance at specific wavelengths; for example, it is preferably a stack of plural layers of different materials, thicknesses, or refractive indices. Examples of materials for forming the semi-transparent reflecting layer 2 are $SiO_2$, $TiO_2$, and so on.

Materials for the anode layers 3 are desirably those having large work functions and are, for example, ITO, tin oxide, gold, platinum, palladium, selenium, iridium, copper iodide, and so on. On the other hand, materials for the cathode layer 6 are desirably those having small work functions and are, for example, Mg/Ag, Mg, Al, Li, In, alloys thereof, and so on.

The organic compound layer 7 may be formed in a single layer structure or in a multiple layer structure and is constructed, for example as illustrated in FIG. 1, of the hole transport layer 4 into which holes are injected from the anode layers 3 and the electron transport layer 5 into which electrons are injected from the cathode layer 6, either one of the hole transport layer 4 and the electron transport layer 5 serving as a light emitting layer. A light emitting layer containing a fluorescent material may also be interposed between the hole transport layer 4 and the electron transport layer 5. The organic compound layer 7 may also be constructed in a single mixed layer structure serving as the hole transport layer 4, as the electron transport layer 5, and as the light emitting layer.

It is desirable to select a material for the organic compound layer 7 from those having spectral luminescence matched with the sensitivity of the photosensitive material of the photosensitive drum used or the like.

The hole transport layer 4 can be made, for example, of N, N'-bis(3-methylphenyl)-N, N'-diphenyl-(1, 1'-biphenyl)-4, 4'-diamine (hereinafter referred to as TPD), and the material for the hole transport layer 4 can also be selected from the following organic materials as well as TPD.

Hole Transporting Compounds
hole transport materials

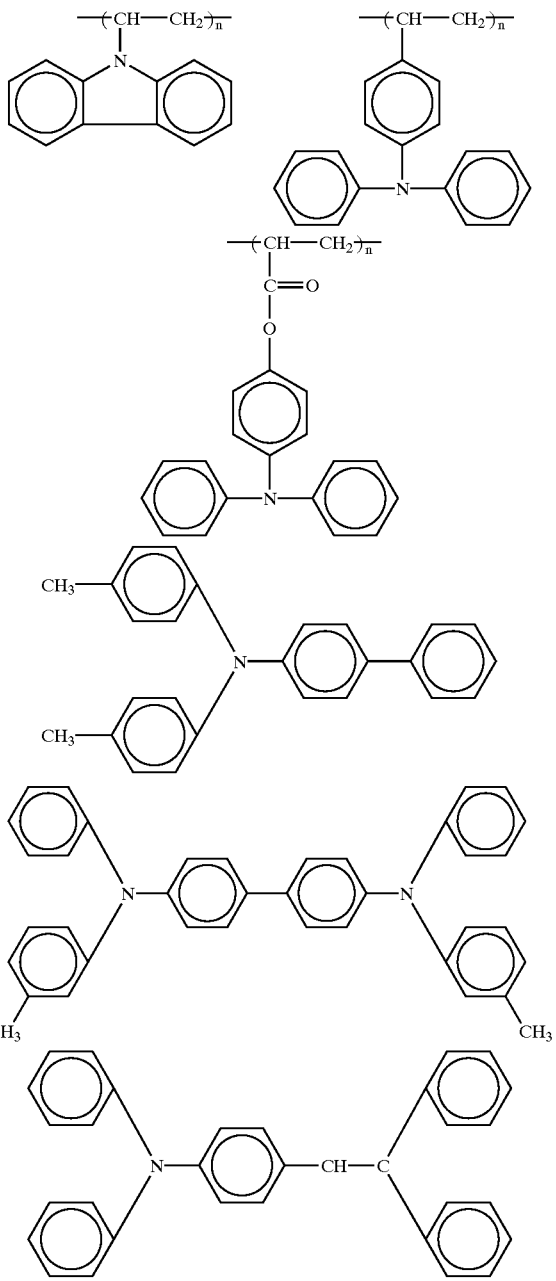

Hole Transmitting Compounds

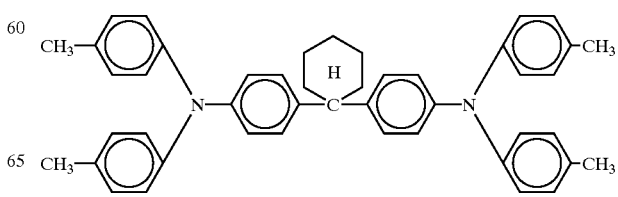

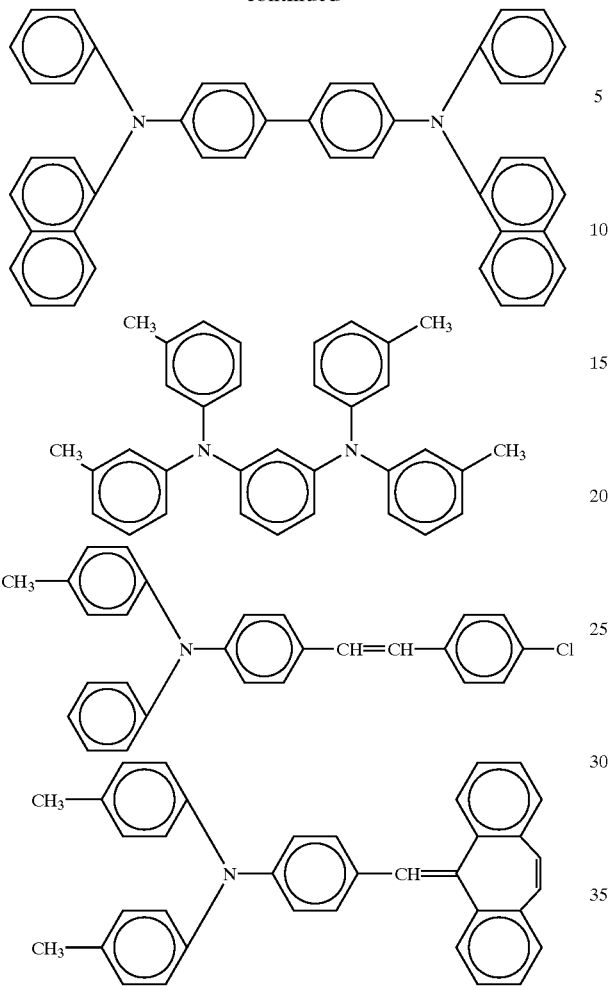
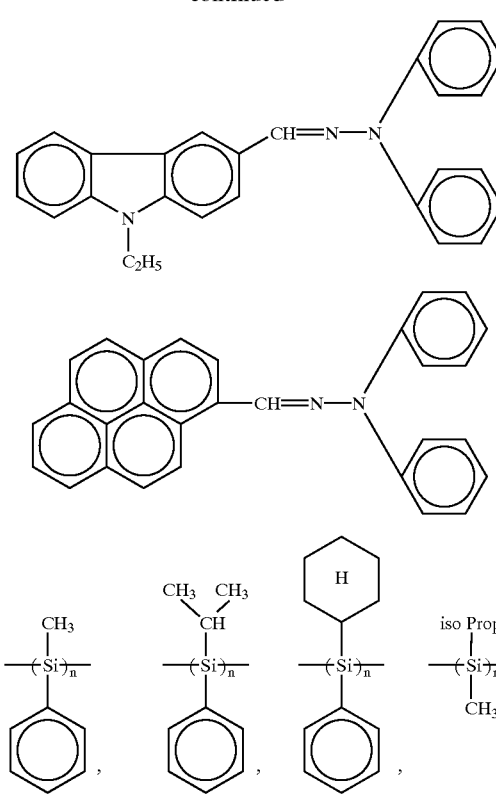
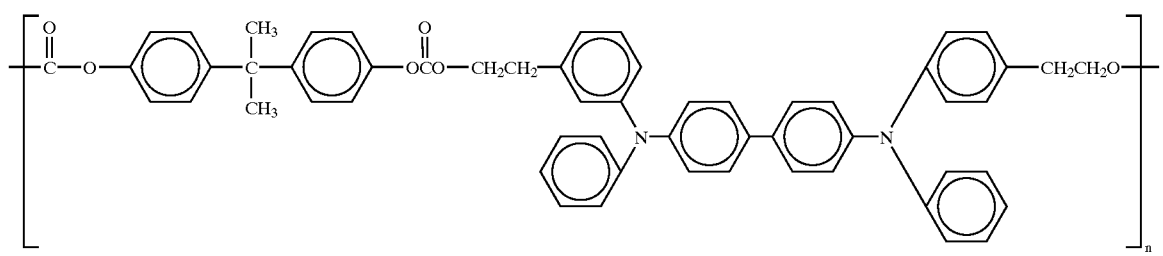
Hole Transporting Compounds
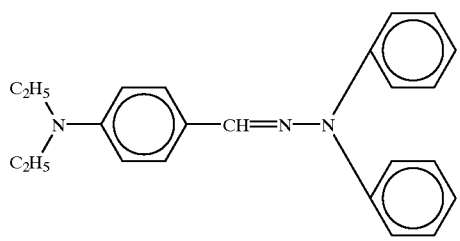

Hole Transporting Compounds

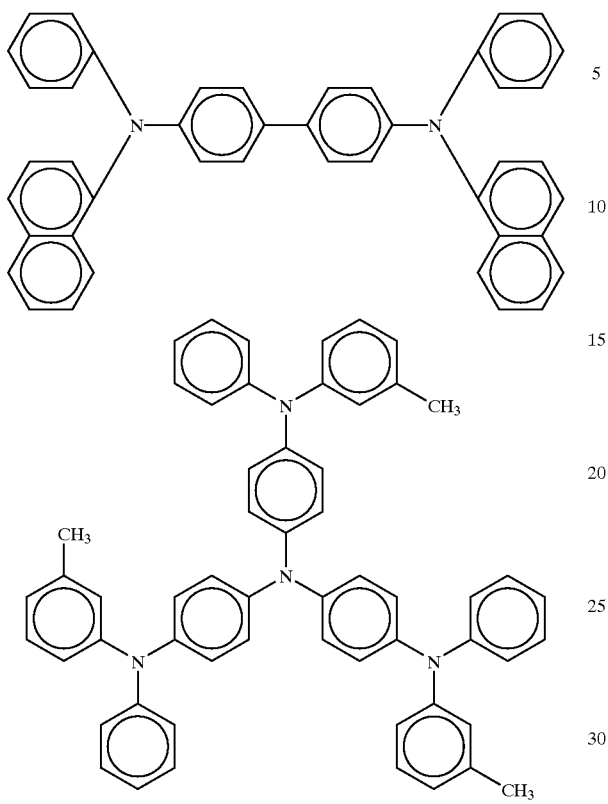

Further, inorganic materials, for example, such as a-Si, a-SiC, or the like may also be used.

The electron transport layer 5 can be made, for example, of tris (8-quinolinol) aluminum (hereinafter referred to as Alq$_3$), and the electron transport layer 5 can also be made of one selected from the following materials, in addition to Alq$_3$.

Electron Transporting Compounds

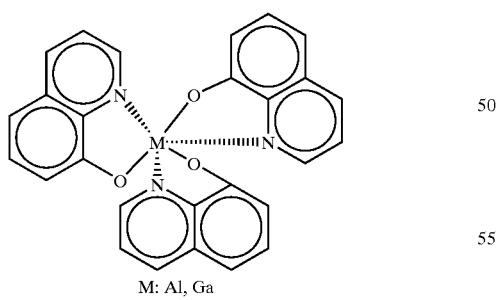

M: Al, Ga

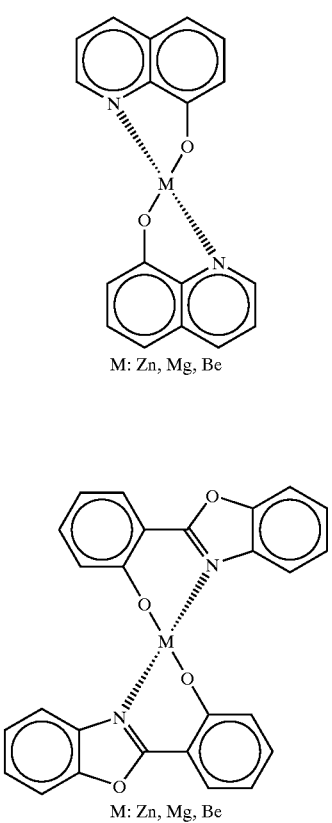

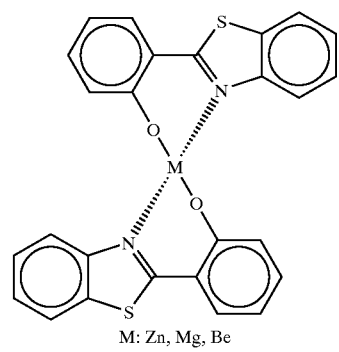

Electron Transporting Compounds

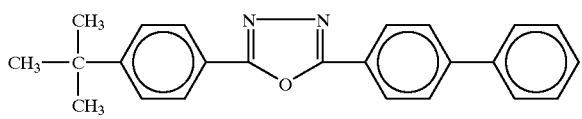

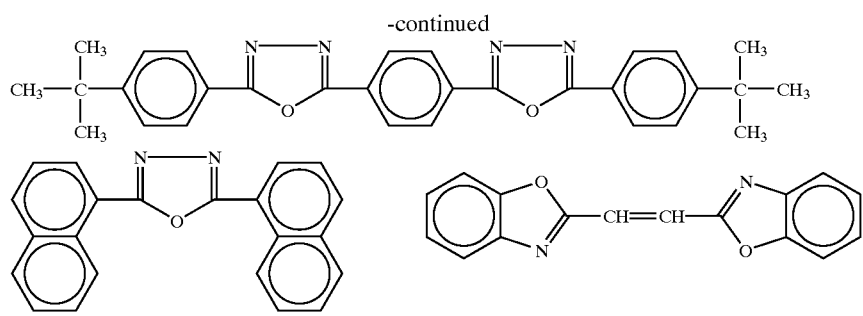
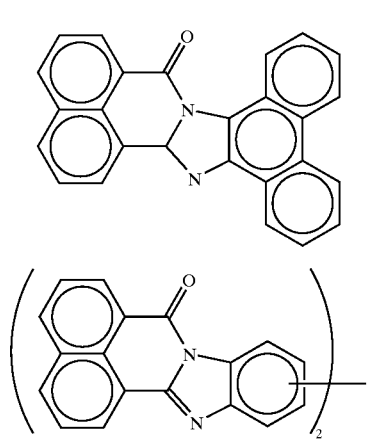
Electron Transporting Compounds
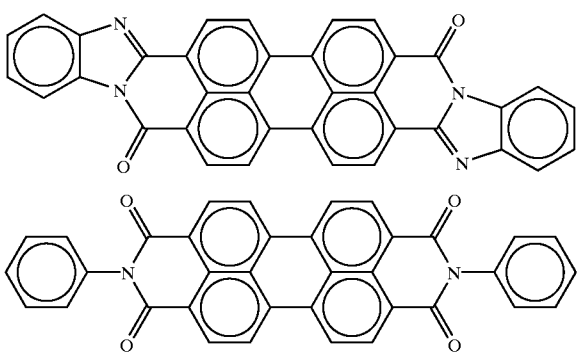
Electron Transporting Compounds
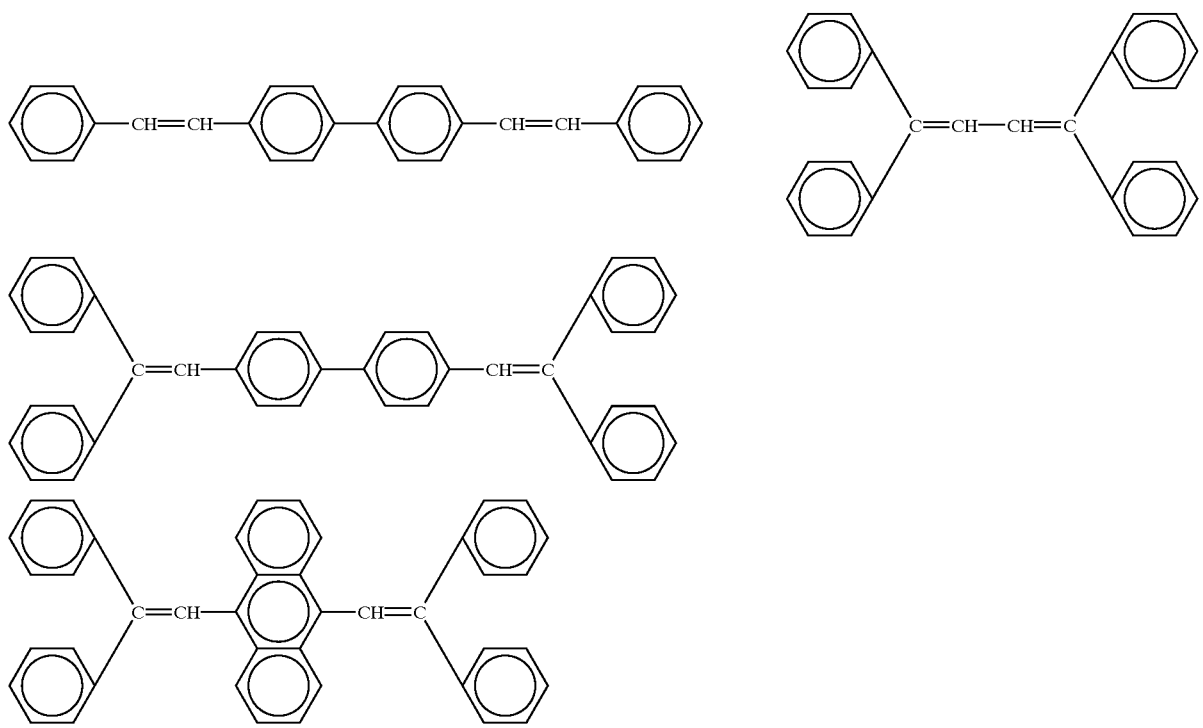

-continued

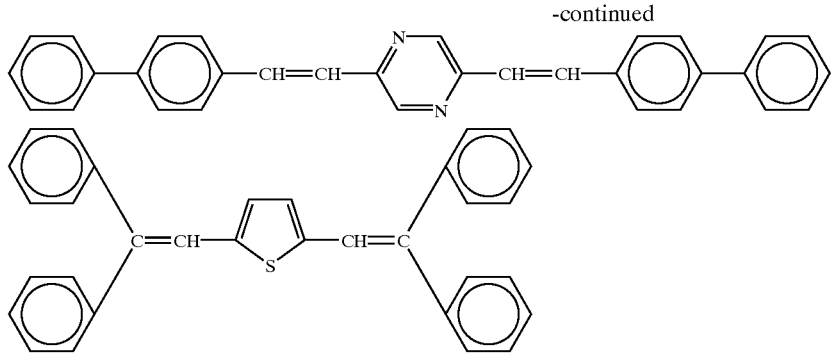

The electron transport layer 5 or the hole transport layer 4 can also be doped with a dopant pigment selected from the following materials.

Dopant Pigments

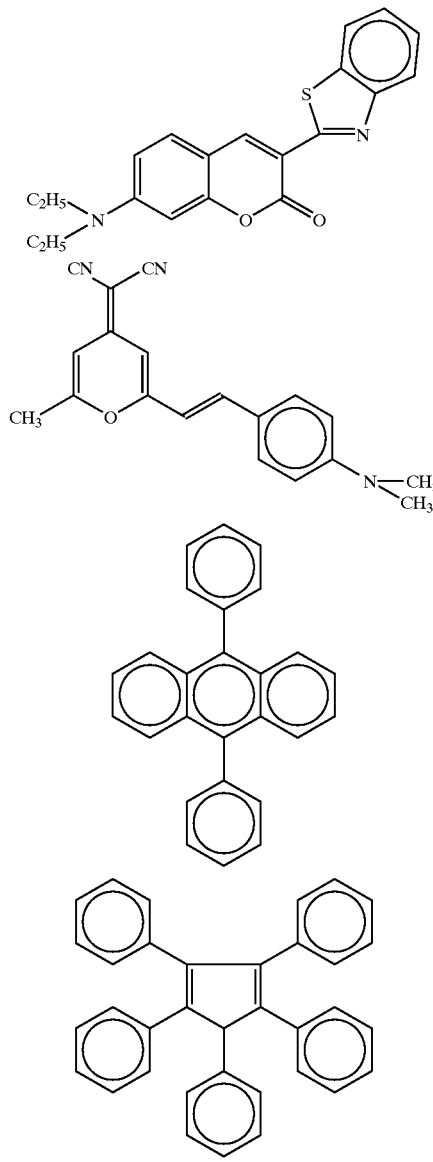

-continued

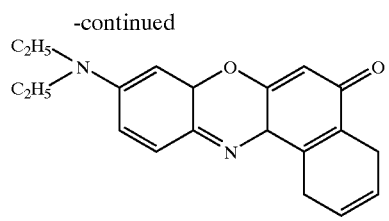

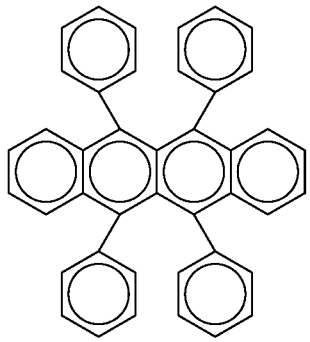

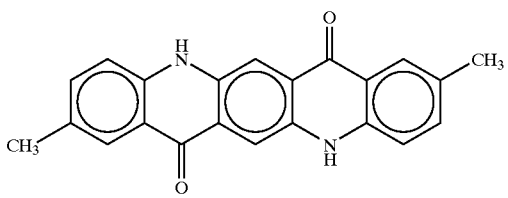

There are no specific restrictions on the thicknesses of the respective layers etc., but they are preferably to be optimized so as to permit extraction of a spectrum matched with the sensitivity of the photosensitive body.

The array of light emitting devices may also be constructed in the reverse stack order to the order of FIG. 1, i.e., in the order of the cathode layer, the organic compound layers, the anode layers, and the semi-transparent reflecting layer successively stacked on the substrate.

Figure 3:
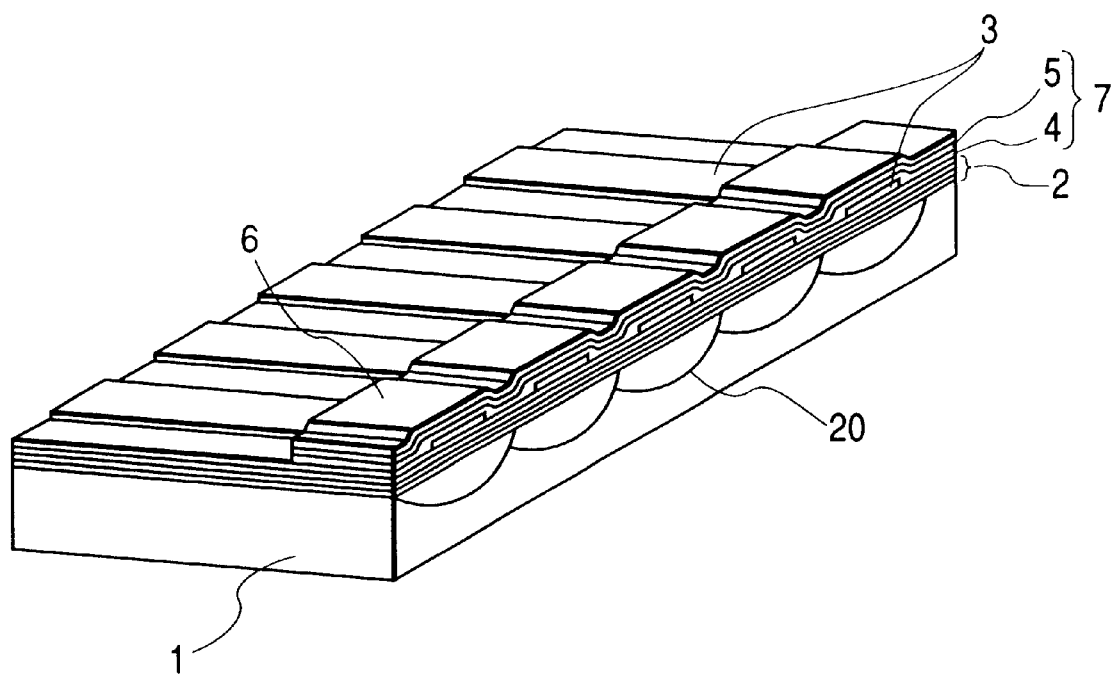
FIG. 3 is a perspective view to show an array of light emitting devices according to a second embodiment of the present invention.

FIG. 3 shows an array of light emitting devices according to the second embodiment of the present invention. Like symbols designate the same or similar portions as in the embodiment illustrated in FIG. 1. The present embodiment is different from the embodiment of FIG. 1 in that microlenses 20 are formed in the substrate 1. The structure and materials of the other portions than the microlenses 20 are similar to those illustrated in FIG. 1.

As illustrated in FIG. 3, the microlenses 20 are formed in one-to-one correspondence to the light emitting portions.

On this occasion, in order to utilize the emitted light efficiently, the area of the aperture portions of the microlenses 20 is preferably larger than the area of the light emitting portions. In order to gain the light quantity efficiently, the focal length of the microlenses 20 is preferably shorter than the distance between the light emitting portions and the microlenses 20 corresponding to the light emitting portions.

The microlenses 20 do not have to be limited to those illustrated in FIG. 3, but they may be any capable of condensing the luminescence from the light emitting portions. Specifically, FIG. 3 shows the microlenses 20 having the convex lens shape with respect to the light emitting portions, but they may also be microlenses having the concave lens shape. FIG. 3 shows the configuration in which the microlenses 20 are formed on the surface of the substrate 1 on the same side as the side where the organic compound layer 7 is formed, but the microlenses 20 may also be formed on the surface of the substrate 1 on the opposite side to the side where the organic compound layer 7 is formed.

Figure 4A:
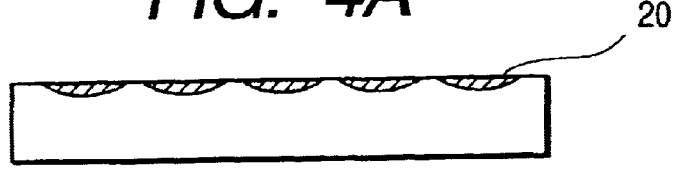
FIGS. 4A, 4B, 4C, 4D and 4E are diagrams to show production steps of the array of light emitting devices according to the second embodiment of the present invention.

An example of steps for producing the array of light emitting devices in the present embodiment will be described along FIGS. 4A to 4E.

a) Production, of microlenses 20 (FIG. 4A)

The microlenses 20 can be formed by ion exchange of the substrate 1 in the portions corresponding to the light emitting portions.

First, the both surfaces of the substrate 1 are cleaned well. Then the entire substrate 1 is masked by an ion-nonpermeable film of Ti or the like. A series of opening portions are formed in a desired diameter and at desired center spacing in the Ti film on the ion diffusion surface by the photolithography etching process. This substrate is immersed, for example, in mixed molten salts of $TlNO_3$ and $KNO_3$, or in a molten salt such as a nitrate, a sulfate, or the like of $Ag^+$, $Tl^+$, or the like to effect the ion exchange process, thereby forming the semispherical microlenses 20.

On this occasion, the microlenses 20 may also be formed so as to have an index profile of several steps.

Figure 4B:
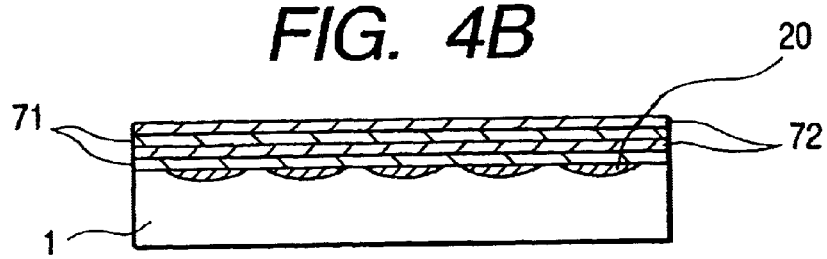
Figure 4C:
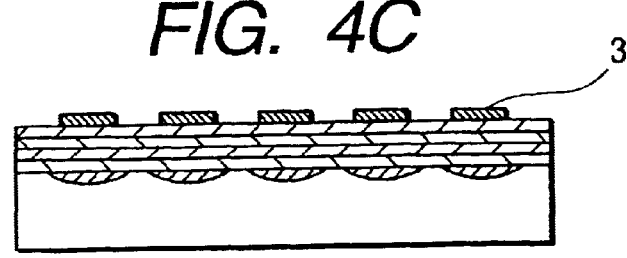
Figure 4D:
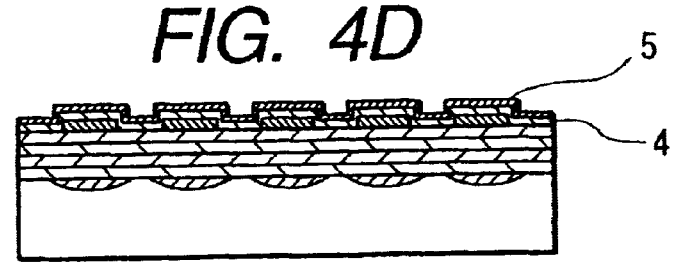
Figure 4E:
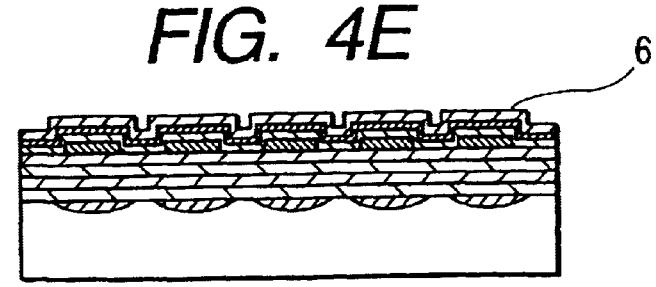

There are no specific restrictions on the method for forming the microlenses 20, and they may be formed by a method using a photoresist, a replica method, etc., as exemplified in the embodiments described hereinafter.

b) As illustrated in FIG. 4B, the semi-transparent reflecting layer 2 composed of plural layers is formed by sputtering on the surface in which the microlenses 20 was formed.

c) As illustrated in FIG. 4C, a metal mask is overlaid on the surface while the line width and pitch are adjusted so that the anode layers 3 are placed on the respective portions corresponding to the microlenses 20, and the anode layers 3 are formed in a predetermined thickness by sputtering.

d) As illustrated in FIG. 4D, the hole transport layer 4 and electron transport layer 5 are evaporated successively by vacuum evaporation.

e) As illustrated in FIG. 4E, while a metal mask is overlaid in a desired line width so as to overlap with the series of microlenses 20, the cathode layer 6 is deposited.

Figure 5:
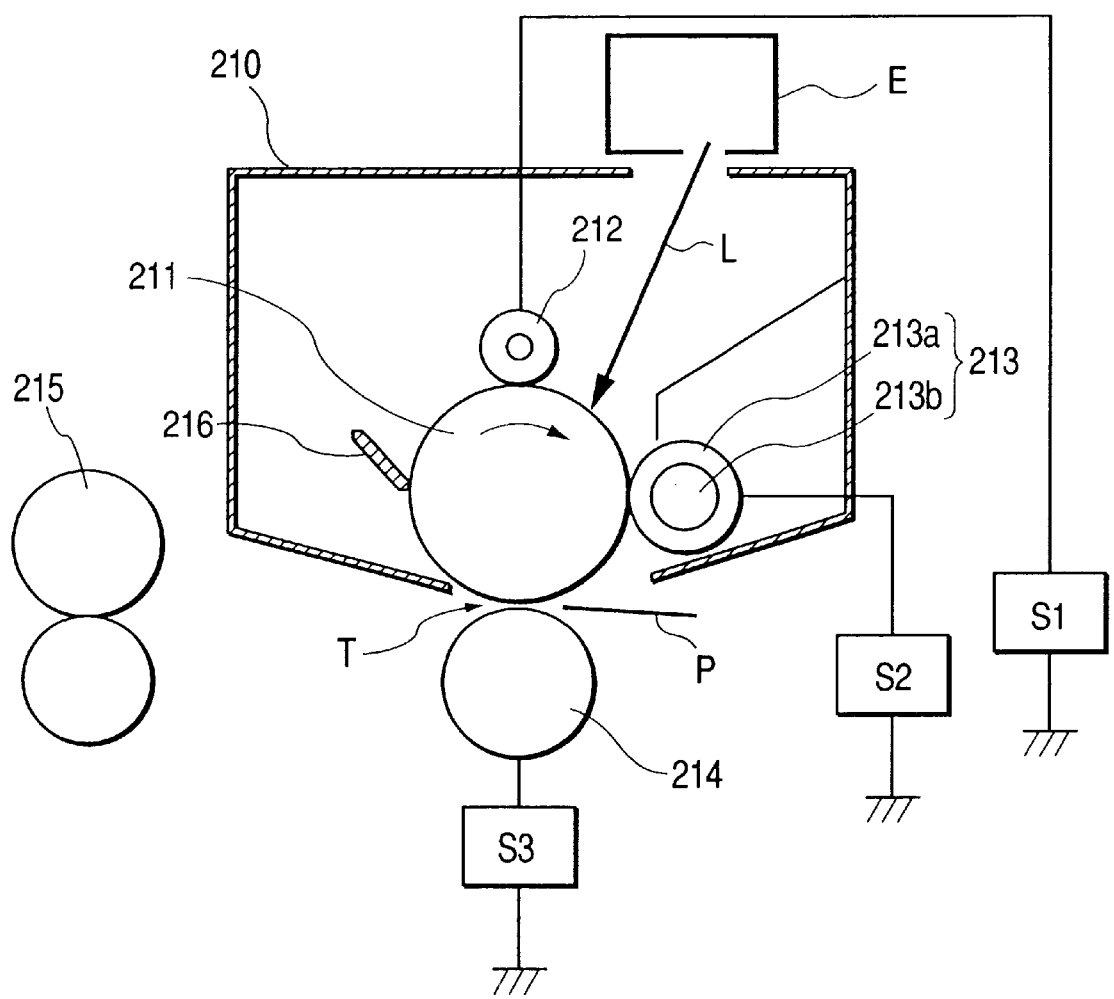
FIG. 5 is a diagram to show a first embodiment of the image forming apparatus according to the present invention.

FIG. 5 is a schematic structural diagram of an image forming apparatus of the electrophotographic method as an example of the image forming apparatus of the present invention.

Reference numeral 211 designates an electrophotographic, photosensitive member of a rotary drum type as an image carrying member, 212 a charging unit, 213 a developing unit, E an exposure unit of the present invention, 214 a transferring unit, 215 a fixing unit, and 216 a cleaning unit.

A driver for driving is connected to the exposure unit E, and when a dc voltage is applied with the anode layers being positive and the cathode layer being negative, the light emitting portions emit green luminescence L and the light can be focused on the photosensitive member 211 to form a good image.

The surface on the photosensitive member 211 is uniformly charged by the charging unit 212. This charged surface of the photosensitive member 211 is exposed to the exposure light L from the exposure unit E in accordance with time-series electrical, digital pixel signals of objective image information outputted, whereupon an electrostatic latent image corresponding to the objective image information is formed on the peripheral surface of the photosensitive member 211. The electrostatic latent image is developed as a toner image by the developing unit with insulating toner. On the other hand, a sheet feed section (not illustrated) supplies a transfer medium P as a recording medium and the transfer medium P is introduced at predetermined timing to a contact nip portion (transfer portion) T between the photosensitive member 211 and the contact transferring unit in contact therewith under predetermined pressing force. The image is transferred to the transfer medium P by applying a predetermined transfer bias voltage.

The transfer medium P after the transfer of the toner image is separated from the surface of the photosensitive member 211 to be introduced to the fixing unit 215 of the thermal fixing method or the like, in which the toner image is fixed. Then the transfer medium P is discharged as an image-formed object (print) out of the apparatus. After the transfer of the toner image onto the transfer medium P, the surface of the photosensitive member is cleaned by removing deposited contaminants including the residual toner or the like by the cleaning unit 216, and then is used repeatedly for formation of image.

Figure 6:
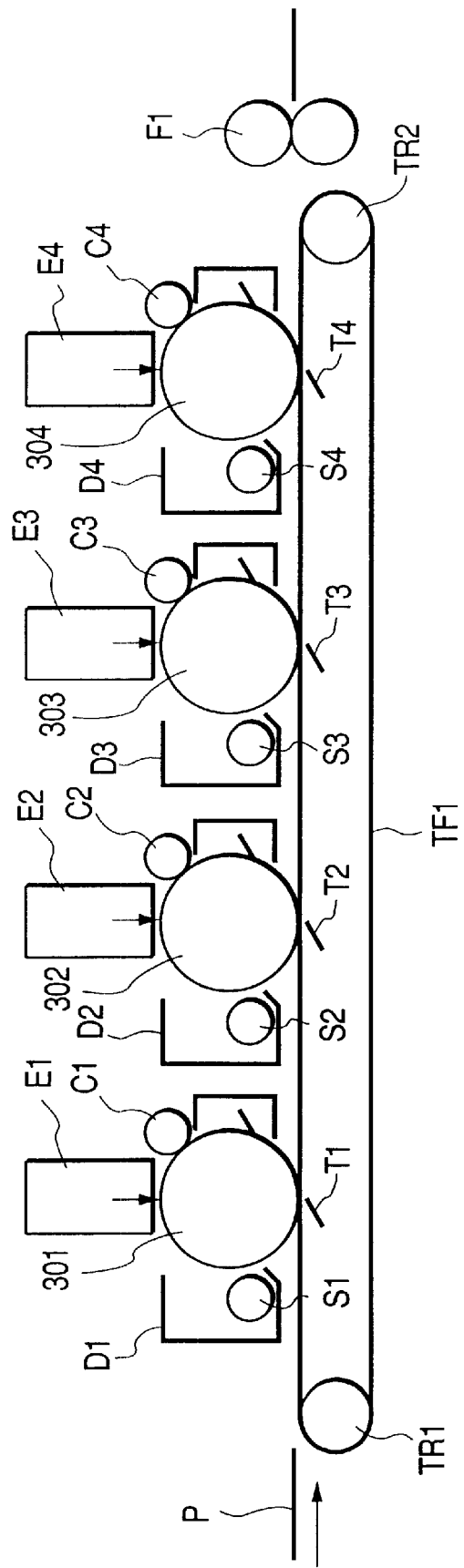
FIG. 6 is a diagram to show a second embodiment of the image forming apparatus according to the present invention.

FIG. 6 is a schematic structural diagram of a multi-color image forming apparatus by the electrophotographic method, as another example of the image forming apparatus of the present invention.

C1 to C4 denote charging units, D1 to D4 developing units, E1 to E4 exposure units of the present invention, S1 to S4 developing sleeves, T1 to T4 transfer blades, TR1 to TR2 rollers, TF1 a transfer belt, P a transfer sheet, F1 a fixing unit, and 301 to 304 electrophotographic, photosensitive members of the rotary drum type.

The transfer sheet P is conveyed in the direction of an arrow to be guided onto the transfer belt TF1 stretched between the rollers TR1, TR2. Then the transfer sheet P is moved by the transfer belt TF1 to a black transfer position set so as to be pinched between the photosensitive member 301 and the transfer blade T1. At this time, the photosensitive member 301 has a desired toner image of black through the electrophotographic process by the charging unit C1, exposure unit E1, and developing sleeve S1 of the developing unit D1 arranged on the drum periphery, and the black toner image is transferred onto the transfer sheet P.

Then the transfer sheet P is moved by the transfer belt TF1 successively to the cyan transfer position set so as to be pinched between the photosensitive member 302 and the transfer blade T2, to the magenta transfer position set so as to be pinched between the photosensitive member 303 and the transfer blade T3, and to the yellow transfer position set so as to be pinched between the photosensitive member 304 and the transfer blade T4. At each of the transfer positions, a cyan toner image, a magenta toner image, or a yellow toner image is transferred onto the transfer sheet P by similar means to those at the black transfer position.

At this time, the registration of image is effected well among the recording operations, because the photosensitive members 301 to 304 are rotating in good order. The transfer sheet P after the multi-color recording according to the above process is supplied to the fixing unit F1 to undergo fixing, thereby obtaining a desired multi-color image.

(Production I of light emitting device array)

The array of light emitting devices illustrated in FIG. 1 were fabricated according to the procedures illustrated in FIGS. 2A to 2D.

The semi-transparent reflecting layer 2 composed of four layers is formed on the transparent, insulating substrate 1, and stacked thereon are the anode layers 3, the hole transport layer 4, the electron transport layer 5 also serving as a light emitting layer, and the cathode layer 6.

In the present embodiment, a glass substrate was employed as the transparent, insulating substrate 1. The both surfaces of this glass substrate were cleaned well.

Figure 2A:
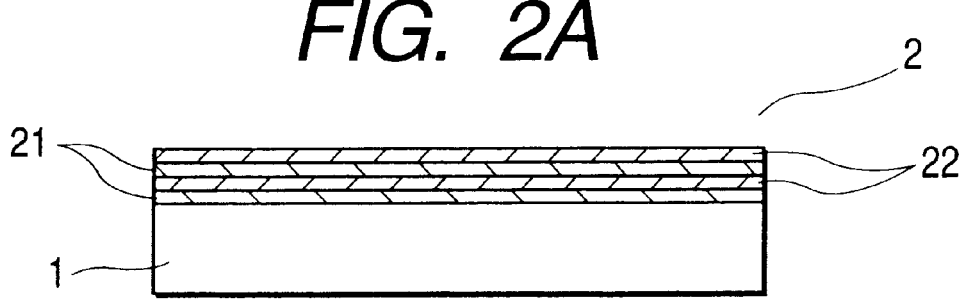
FIGS. 2A, 2B, 2C and 2D are diagrams to show production steps of the array of light emitting devices according to the first embodiment of the present invention.

Then, as illustrated in FIG. 2A, $SiO_2$ layers 21 93 nm thick and $TiO_2$ layers 22 59 nm thick were alternately deposited on the substrate 1 by sputtering, thereby forming the semi-transparent reflecting layer 2.

Figure 2B:
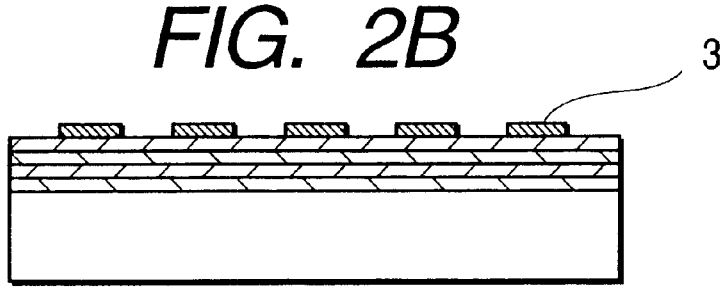

Next, as illustrated in FIG. 2B, while the metal mask having the line width of 50 μm and the pitch of 80 μm was placed on the semi-transparent reflecting layer 2, ITO was deposited as the anode layers 3 in the thickness of 60 nm by sputtering.

Figure 2C:
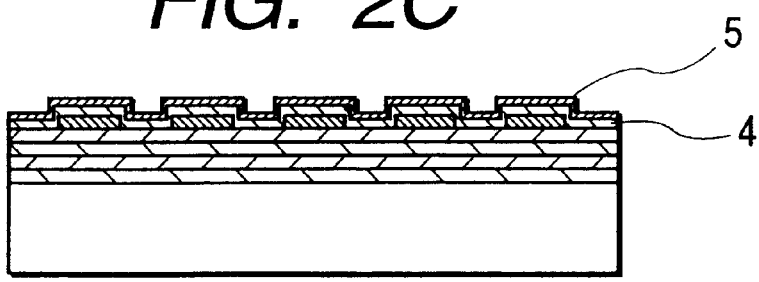

Then, as illustrated in FIG. 2C, TPD and $Alq_3$ were evaporated successively as the hole transport layer 4 in the thickness of 40 nm and as the electron transport layer 5 in the thickness of 50 nm, respectively, by vacuum evaporation. The vacuum during the evaporation was 2 to $3 \times 10^{-6}$ Torr and film-forming rates were 0.2 to 0.3 nm/s.

Figure 2D:
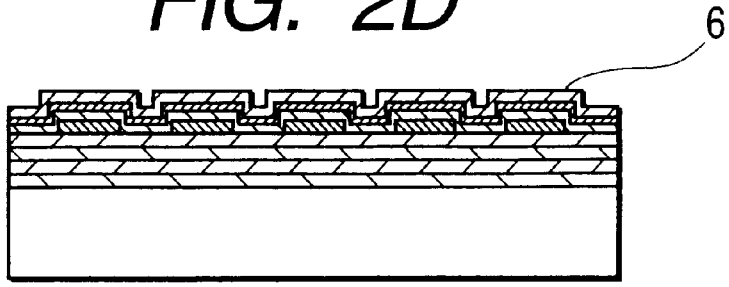

Finally, as illustrated in FIG. 2D, while the metal mask having the line width of 40 μm was placed perpendicular to the anode layers 3, Mg and Ag were coevaporated as the cathode layer 6 at the evaporation rate ratio of 10:1 to form an alloy of Mg and Ag at the ratio of 10:1 in the thickness of 200 nm. At this time, the film-forming rate was 1 nm/s.

When the dc voltage was applied to the array of light emitting devices thus obtained with the ITO electrodes of the anode layers being positive and with the Mg/Ag electrode of the cathode layer being negative, green luminescence was emitted from the intersecting portions between the ITO electrodes and the Mg/Ag electrode.

Figure 7:
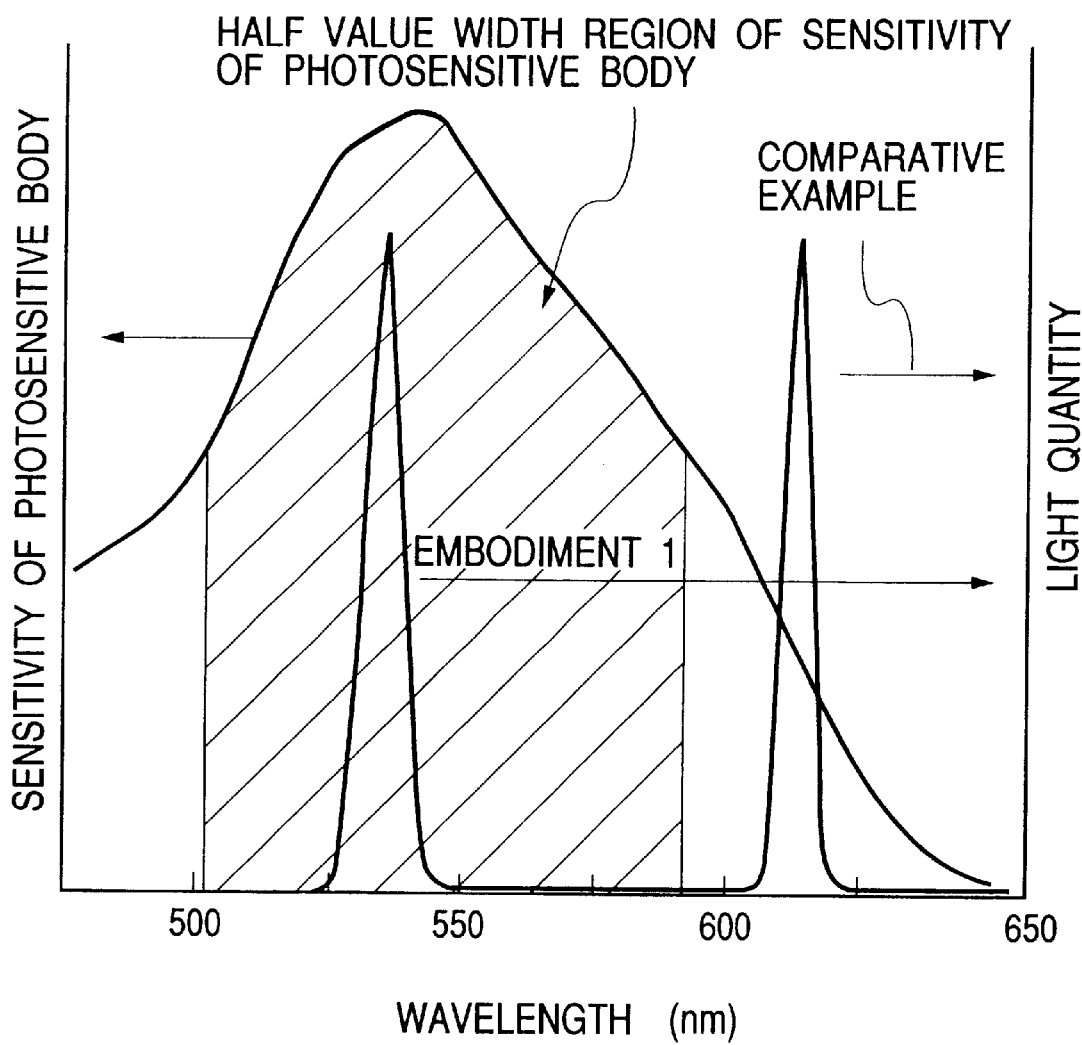
FIG. 7 is a graph to show the relationship between spectral sensitivity of the photosensitive body and emission wavelength of the array of light emitting devices in the image forming apparatus of the first embodiment.

This light emitting device array, and an array of light emitting devices having different thicknesses of the semi-transparent reflecting layer, the organic compound layer, etc. (comparative example) were connected to the driving driver, and writing on the photosensitive member was carried out using them as a light source for electrophotography to output actual images. FIG. 7 shows the sensitivity characteristics of the photosensitive member and emission spectra of the light emitting device arrays.

As illustrated in FIG. 7, the light emitting device array of Embodiment 1 had the emission peak wavelength in the half width area of sensitivity of the photosensitive member and good images were able to be obtained thereby. On the other hand, the light emitting device array of the comparative example had the emission peak outside the half width area of sensitivity of the photosensitive member, and, therefore, the potential of the photosensitive member was not lowered to the desired potential. Images were thus blurred, so that the light emitting device array of the comparative example failed to obtain good images.

Further, several types of light emitting device arrays having different emission peak wavelengths were prepared and image outputs were obtained thereby. It was then verified that the array needed to have the emission peak wavelength at least in the half width area of sensitivity of the photosensitive member in order to obtain good images. Although good images can be obtained by increasing the driving voltage even if the emission peak wavelength is off the half width area of sensitivity of the photosensitive member, this is not preferable, because there arises a problem of shortening the life of the devices.

Use of the light emitting device array having the optical cavity structures as described above permits the diffusion of light to be suppressed and also permits the spread of exposure spots to be reduced. In addition, it can narrow the half width of emission wavelengths and enhance the output at the peak wavelength, whereby the quantity of emitted light can be utilized efficiently.

In the present embodiment the array of light emitting devices were produced in 300 dpi, but the light emitting points can be obtained in arbitrary size by changing the electrode width.

(Addition of rod lens array)

The exposure apparatus was composed of the light emitting device array of Embodiment 1 and an array of rod lenses. The exposure apparatus was arranged to focus the light emitted from the light emitting device array through the rod lens array on the photosensitive member. Using the exposure apparatus, actual images were outputted in similar fashion to those in Embodiment 1, and the obtained image were high-definition images. Since the light emitting device array had the optical cavity structures, it suppressed the diffusion of emitted light, remarkably enhanced the light incidence efficiency into the rod lens array, and permitted efficient utilization of the emitted light.

On the other hand, the light emitting device array without the optical cavity structures had poor light incidence efficiency into the rod lens array and failed to focus most light on the drum, because the emitted light diffused.

As described above, to provide the light emitting device array with the optical cavity structures made it possible to realize an optical printer head capable of obtaining high-definition images at low power.

(Production II of light emitting device array)

The light emitting device array illustrated in FIG. 3 was produced according to the procedures illustrated in FIGS. 4A to 4E.

The microlenses 20 are formed by the ion exchange method in the portions corresponding to the respective light emitting portions in the transparent, insulating substrate 1, and stacked thereon are the dielectric layer 2, the anode layers 3, the hole transport layer 4, the electron transport layer 5 also serving as a light emitting layer, and the cathode layer 6.

First, the method for producing the microlenses 20 in the substrate 1 will be described.

In the present embodiment a soda lime glass substrate was used as the transparent, insulating substrate 1. The both surfaces of this glass substrate were cleaned well.

Then the whole glass substrate was masked by a Ti film. A series of opening portions were formed in the diameter of 30 μm and at the center spacing of 80 μm in the Ti film on the ion diffusion surface by the photolithography etching process.

This substrate was immersed in mixed molten salts of $TlNO_3$ and $KNO_3$ for effecting ion exchange, thereby forming semispherical index areas (microlenses) 20 having the diameter of about 70 μm.

Then the light emitting device array was formed by the process similar to that illustrated in FIGS. 2A to 2D, on the surface where the microlenses 20 were formed.

The aperture area of the microlenses 20 was set larger than the area of the light emitting portions, so as to gain the emitted light efficiently.

Use of the light emitting device array having the microlenses and the optical cavity structures as described above made it possible to suppress the diffusion of light, to decrease the spread of exposure light, and to focus the image on the photosensitive member by the microlenses. Since use of such apparatus also made it possible to narrow the half width of emitted light wavelengths and enhance the output at the peak wavelength, it permitted efficient utilization of emitted light quantity.

(Embodiment 3)

Figure 8:
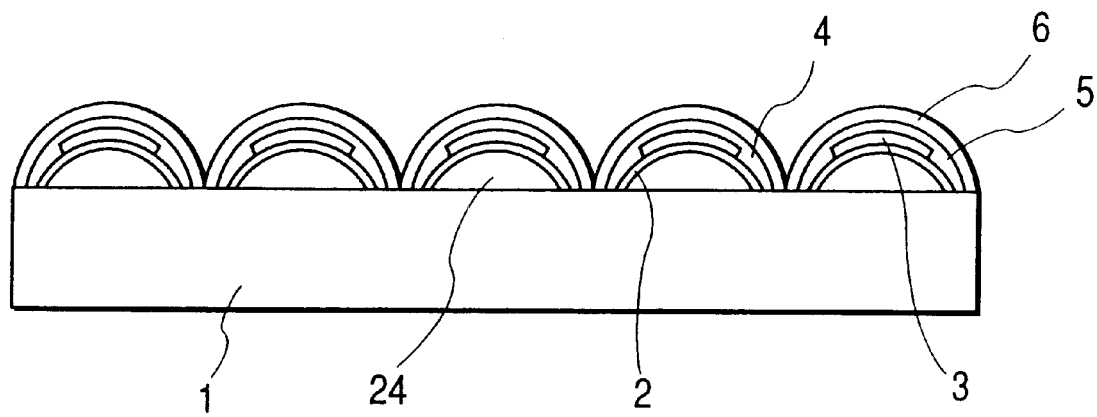
FIG. 8 is a diagram to show an array of light emitting devices according to a third embodiment of the present invention.

FIG. 8 is a sectional view of a light emitting device array of the third embodiment.

The microlenses 24 having the convex lens shape are formed in portions corresponding to the respective light emitting portions in the glass substrate as the substrate 1, and stacked thereon are the semi-transparent reflecting layer 2, the anode layers 3, the hole transport layer 4, the electron transport layer 5 also serving as a light emitting layer, and the cathode layer 6.

First, a method for producing the microlenses 24 on the glass substrate will be explained.

Materials for formation of the lenses are normal ultraviolet and far ultraviolet photoresists and particularly desirable materials are positive far ultraviolet photoresists of the polymethyl methacrylate type, PMIPK type, polyglycylmethyl acrylate type, phenol novolak type, etc., because they soften at relatively low temperature and readily form the condenser lens shape.

A photoresist selected from the above materials was laid on the glass substrate by a method such as coating or the like, and the photoresist layer was then subjected to photolithography and patterning by a pattern forming method such as the lift-off method, the dry etching method, or the like in the pattern of microlenses in the diameter of 70 μm and at the center spacing of 80 μm. This patterned photoresist was annealed to soften and fluidize, thereby forming the circular microlenses 24.

Then the semi-transparent reflecting layer 2 was formed in similar fashion to that in Embodiment 2 and thereafter the metal mask having the line width of 50 μm and the pitch of 80 μm was laid thereon so as to match with the microlenses 24. With the metal mask, ITO was deposited as the anode layers 3 in the thickness of 60 nm by sputtering.

Then TPD and Alq$_3$ were successively evaporated as the hole transport layer 4 and as the electron transport layer 5, respectively, by vacuum evaporation, as in Embodiment 2. The vacuum during the evaporation was 2 to 3×10$^{-6}$ Torr, and the film-forming rates were 0.2 to 0.3 nm/s.

Finally, the metal mask having the line width of 40 μm was overlaid on the string of microlenses 24 and Mg and Ag were coevaporated as the cathode layer 6 at the evaporation rate ratio of 10:1, thereby forming the alloy of Mg and Ag at the ratio of 10:1 in the thickness of 200 nm. At this time, the film-forming rate was 1 nm/s.

The driving driver was connected to the light emitting device array obtained in this way and it was used as a light source for electrophotography. Green luminescence was emitted from the intersecting portions between the ITO electrodes and the Mg/Ag electrode, as in Embodiment 2, and the light was able to be focused on the photosensitive drum surface through the semi-transparent reflecting layer 2 and the microlenses 24, so as to be able to obtain good images.

As described above, the optical printer head capable of obtaining high-definition images at low power was able to be realized by providing the light emitting device array with the optical cavity structures.

(Embodiment 4)

Figure 9:
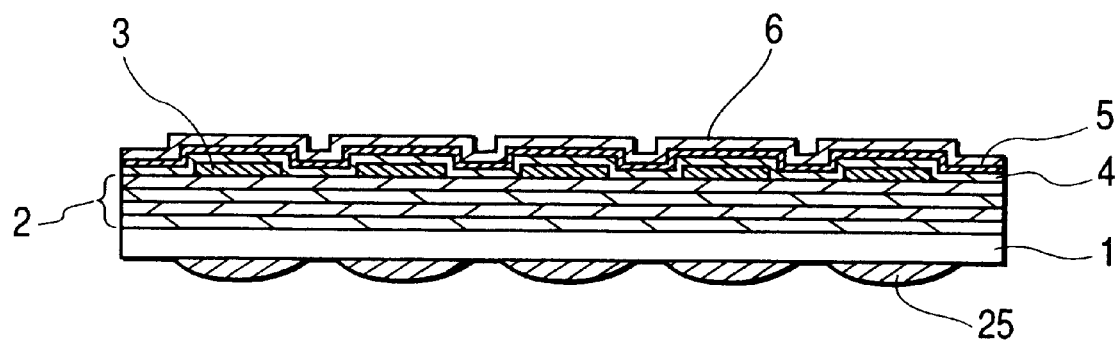
FIG. 9 is a diagram to show an array of light emitting devices according to a fourth embodiment of the present invention.

FIG. 9 shows the structure of the fourth embodiment of the light emitting device array.

An organic LED array illustrated in FIG. 9 was produced according to the procedures illustrated in FIGS. 10A to 10D.

The microlenses 25 having the convex lens shape are formed in the portions corresponding to the respective light emitting portions on the glass substrate as the substrate 1, and stacked on the surface of the substrate 1 on the opposite side to the microlenses 25 are the semi-transparent reflecting layer 2, the anode layers 3, the hole transport layer 4, the electron transport layer 5 also serving as a light emitting layer, and the cathode layer 6.

Figure 10A:
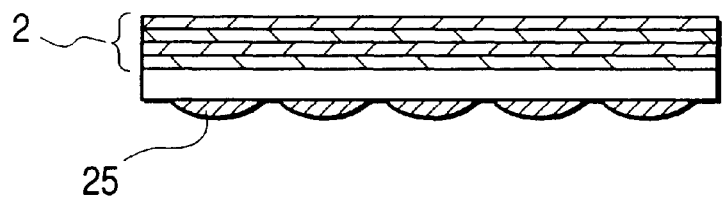
FIGS. 10A, 10B, 10C and 10D are diagrams to show production steps of the array of light emitting devices according to the fourth embodiment of the present invention.

First, a method for producing the microlenses 25 on the glass substrate will be described. As illustrated in FIG. 10A, an array of microlenses 25 were formed with the aperture portions having the diameter of 25 μm and the center spacing of 80 μm by the replica method. Then the semi-transparent reflecting layer 2 was formed on the opposite surface to the microlenses 25 in similar manner to that in Embodiment 1.

Figure 10B:
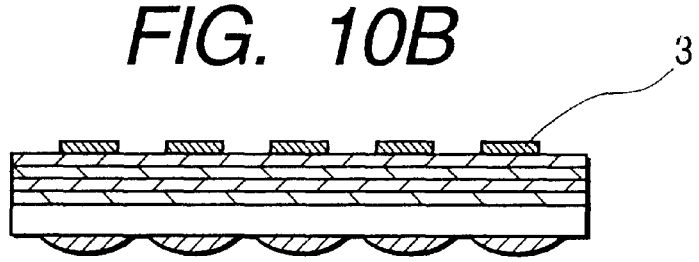

As illustrated in FIG. 10B, while the metal mask having the line width of 50 μm and the pitch of 80 μm was overlaid corresponding to the microlenses 25 on the opposite surface to the surface where the microlenses 25 were formed, ITO was deposited as the anode layers 3 in the thickness of 60 nm.

Figure 10C:
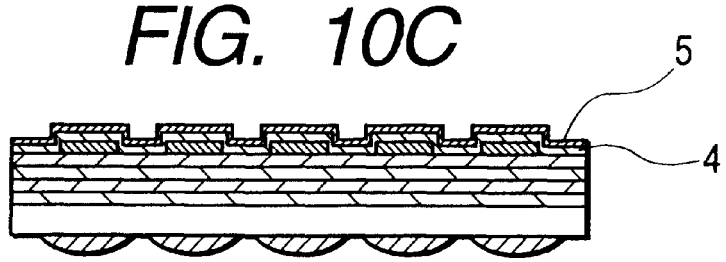

Then, as illustrated in FIG. 10C, TPD and Alq$_3$ were evaporated successively as the hole transport layer 4 and as the electron transport layer 5, respectively, by vacuum evaporation, as in Embodiment 1.

Figure 10D:
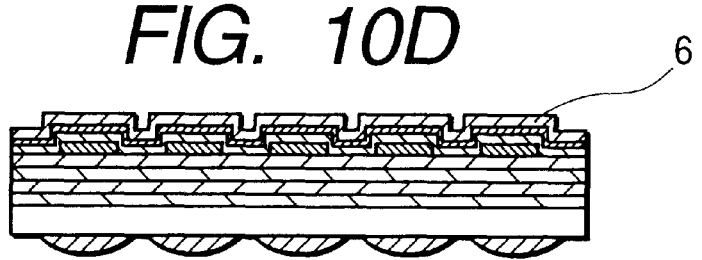

Finally, as illustrated in FIG. 10D, while the metal mask having the line width of 40 μm was overlaid on the string of microlenses 25, Mg and Ag were coevaporated as the cathode layer 6 at the evaporation rate ratio of 10:1, thereby forming the alloy of Mg and Ag at the ratio of 10:1 in the thickness of 200 nm.

The driving driver was connected to the organic LED array thus obtained, and it was used as a light source for electrophotography, so as to be able to obtain good images.

As described above, the present invention permits production of the exposure apparatus and image forming apparatus such as the optical printer heads or the like capable of realizing the high-speed operation, compact size, low cost, and high definition and also capable of efficiently utilizing the quantity of emitted light from the light emitting devices.

What is claimed is:

1. An exposure apparatus for exposing a photosensitive body comprising:

a substrate, a convex lens disposed on said substrate, a semitransparent reflection layer disposed on said convex lens, and a pair of electrodes, and a light-emitting layer between said pair of electrodes, disposed on said semitransparent reflection layer, wherein said semitransparent reflection layer and said pair of electrodes and said light-emitting layer each has a curved shape corresponding to a curved shape of said convex lens, and a luminescent point of light is provided between said electrodes only inside a curved portion of said lens, and wherein one of said electrodes is a cathode and the portion of said apparatus between said cathode and said semitransparent layer constitutes a micro-resonator which limits wavelengths of light emitted from said light emitting layer so that a peak wavelength of the emitted light is disposed within a half-value width region of sensitivity of the photosensitive body.

2. A light source comprising a plurality of exposure apparatuses, according to claim 1, arranged in an array.

3. A light source according to claim 2, wherein each one of said exposure apparatuses has an anode as one of said electrodes, and a said light-emitting region disposed at a position at which the anode and the cathode are mutually aligned, and the light-emitting region has a length along a longitudinal direction of a photosensitive body exposed by said light source which longitudinal length is longer than the length of the light-emitting region along a direction perpendicular to the longitudinal direction.

* * * * *

UNITED STATES PATENT AND TRADEMARK OFFICE
CERTIFICATE OF CORRECTION

PATENT NO.    : 6,661,445 B2
DATED         : December 9, 2003
INVENTOR(S)   : Seji Mashimo et al.

It is certified that error appears in the above-identified patent and that said Letters Patent is hereby corrected as shown below:

<u>Title page, Item [54] and Column 1, lines 1-2,</u>
Title, "EXPOSURE APPARATUS WITH AN ARRAY OF LIGHT EMITTING DEVICES" should read -- EXPOSURE APPARATUS EMBODYING A LIGHT-EMITTING REGION --.

<u>Column 1,</u>
Line 33, "Light" should read -- light --.

<u>Column 3,</u>
Line 28, "Light" should read -- light --.

<u>Column 4,</u>
Line 57, "Transmitting" should read -- Transporting --.

<u>Column 13,</u>
Line 22, "a) Production," should read -- a) Production --.
Line 26, "the both" should read -- both --.

<u>Column 15,</u>
Line 17, "The both" should read -- Both --.

<u>Column 16,</u>
Line 26, "image" should read -- images --.
Line 54, "The both" should read -- Both --.

Signed and Sealed this

Thirteenth Day of July, 2004

JON W. DUDAS
*Acting Director of the United States Patent and Trademark Office*